(12) United States Patent
Wang et al.

(10) Patent No.: US 7,032,652 B2
(45) Date of Patent: Apr. 25, 2006

(54) STRUCTURE OF HEAT CONDUCTIVE PLATE

(75) Inventors: Chin Wen Wang, Pingjhen (TW); Pei Choa Wang, Pingjhen (TW); Ching Chung Wang, Pingjhen (TW)

(73) Assignee: Augux Co., Ltd., Taoyuan (TW)

( * ) Notice: Subject to any disclaimer, the term of this patent is extended or adjusted under 35 U.S.C. 154(b) by 0 days.

(21) Appl. No.: 10/883,709

(22) Filed: Jul. 6, 2004

(65) Prior Publication Data

US 2006/0005950 A1   Jan. 12, 2006

(51) Int. Cl.
*F28D 15/00*   (2006.01)
(52) U.S. Cl. .......................... 165/104.26; 165/104.33; 361/700; 257/715; 174/15.2
(58) Field of Classification Search ................ 165/185, 165/104.26, 104.21, 104.33, 80.3; 361/699, 361/700; 174/15.2; 257/714–716
See application file for complete search history.

(56) References Cited

U.S. PATENT DOCUMENTS

| | | | | | |
|---|---|---|---|---|---|
| 3,680,189 | A | * | 8/1972 | Noren .................... | 29/890.032 |
| 4,046,190 | A | * | 9/1977 | Marcus et al. .......... | 165/104.26 |
| 5,465,782 | A | * | 11/1995 | Sun et al. ............... | 165/104.26 |
| 6,056,044 | A | * | 5/2000 | Benson et al. .......... | 165/104.26 |
| 6,082,443 | A | * | 7/2000 | Yamamoto et al. ..... | 165/104.26 |
| 6,227,287 | B1 | * | 5/2001 | Tanaka et al. ........... | 165/80.4 |
| 6,269,866 | B1 | * | 8/2001 | Yamamoto et al. ..... | 165/104.26 |
| 6,477,045 | B1 | * | 11/2002 | Wang ........................ | 361/700 |
| 6,679,318 | B1 | * | 1/2004 | Bakke .................... | 165/104.26 |
| 6,901,994 | B1 | * | 6/2005 | Jin-Cherng et al. ..... | 165/104.26 |
| 6,957,692 | B1 | * | 10/2005 | Win-Haw et al. ....... | 165/104.33 |
| 2003/0121645 | A1 | * | 7/2003 | Wang ..................... | 165/104.26 |
| 2004/0069455 | A1 | * | 4/2004 | Lindemuth et al. ..... | 165/104.15 |

FOREIGN PATENT DOCUMENTS

| | | | | | |
|---|---|---|---|---|---|
| JP | 58-96992 | * | 6/1983 | ............ | 165/104.26 |
| JP | 6-112380 | * | 4/1994 | ............ | 165/104.26 |
| JP | 11-193994 | * | 7/1999 | ............ | 165/104.26 |
| JP | 2001-255085 | * | 9/2001 | ............ | 165/104.26 |
| JP | 2001-339026 | * | 12/2001 | ............ | 165/104.26 |
| JP | 2002-62067 | * | 2/2002 | ............ | 165/104.26 |

* cited by examiner

*Primary Examiner*—Terrell McKinnon

(57) ABSTRACT

A heat conductive plate includes a hollow case and a plurality of grooves respectively formed on the inner top wall and the inner bottom wall of the case. In addition, a plurality of supporting members are positioned in the case by way of powder sintering, wherein each surface of the supporting members has a porous wick structure formed thereon. Thus, the case can be sustained by the supports with each wick structure firmly mounted in the grooves of the inner walls thereof. When performing heat transferring, the working fluid is heated to be formed as vapor by the electronic element mounted on the outer bottom surface so as to flow toward the inner top surface of the case. The working fluid is then cooled to be liquid again to be absorbed by the wick structures of the supporting members and be transported toward the inner bottom of the case.

3 Claims, 6 Drawing Sheets

STRUCTURE OF HEAT CONDUCTIVE PLATE

BACKGROUND OF THE INVENTION

The present invention relates to a structure of a heat conductive plate, more particular, to a structure of a heat conductive plate for heat interchange with an electric element (such as CPU), which can increase the variation and speed of the vaporation of working fluid to promote the cooling efficiency.

With developing of the technology and industry, the arithmetic of computer becomes faster and faster, especially when the faster operation of the computer is, the higher heat is produced. In order to effectively dissipate the highly concentrated heat out of the host and maintain the CPU under an allowable temperature, a heat sink is positioned in the CPU to assist the cooling and expedite the dissipation. However, when the higher heat is produced due to the faster arithmetic of the CPU, a conventional aluminum extruded heat sink and cooling fan cannot meet the requirement.

Therefore, a conventional heat conductive plate is provided. As shown in FIG. 1, a heat conductive plate 10a has a hollow case 1a, wherein a wick structure 2a is located to the inner wall of the case 1a, and a supporting member 3a is mounted within the case 1a. After vacuuming the air out of the case 1a, and making supporting member 3a to sustain the case, the heat produced by the operation of the CPU will be absorbed and interchanged by the working fluid within the case 1a and then transport upwardly. Since the top inner surface of the case 1a is farther from the heat source and has lower temperature, the heated working fluid around the top areas of the case 1a can be condensed again to liquid, and the liquid working fluid will be lead to the inner bottom of the case 1a by wick structure 2a to continue the operation of the heat interchange.

Nevertheless, the conventional heat conductive plate has following defeats:
  (a) The wick structure 2a within the heat conductive plate 10a is merely attached on the inner wall of the case rather than entirely bonded. If some space exists between wick structure 2 and inner wall, then the speed and time that the working fluid leaded to the bottom of the case 1a by the wick structure 2a will be slow down and affect the efficiency of the dissipation.
  (b) The wick structure 2a is only attached to the inner wall, so the condensed working fluid cannot be rapidly absorbed by the wick structure 2a and thereby the heat interchange of the conventional heat conductive plate 10a is not effective.

Owing to the problems from the conventional heat conductive plate, the present invention is disclosed based on the experience and researches from the inventor.

BRIEF SUMMARY OF THE INVENTION

The present invention is to provide a structure of a heat conductive plate of which a wick structure to be formed on a supporting member is firmly mounted to the inner wall of the heat conductive plate so as to improve the heat transferring efficiency.

Further, the present invention is to provide a structure of a heat conductive plate with increasing cooling area inside to make the heated working fluid from the heat source capable of being rapidly condensed to liquid.

Still further, the present invention is to provide a structure of a heat conductive plate with enhanced capillary absorption ability to rapidly circulate working fluid for operation, thereby the variation and speed of the vaporization of the working fluid are increased to promote the dissipating efficiency of the heat conductive plate.

Accordingly, a heat conductive plate of the present invention includes a hollow case and a plurality of grooves respectively formed on the inner top wall and the inner bottom wall of the case. In addition, a plurality of supporting members are positioned in the case by way of powder sintering, wherein each surface of the supporting members has a porous wick structure formed thereon. Thereafter, the working fluid is filled in the case. Thus, the case can be sustained by the supports with each wick structure firmly mounted in the grooves of the inner walls thereof. When performing heat transferring, the working fluid is heated to be formed as vapor by the electronic element mounted on the outer bottom surface so as to flow toward the inner top surface of the case. The working fluid is then cooled to be liquid again to be absorbed by the wick structures of the supporting members and be transported toward the inner bottom of the case.

Another character of the present invention is that the case is composed of a top and bottom cover. Inner surfaces of the top and bottom covers respectively position a plurality of parallel lateral grooves and a small amount of metal sinters to the location relative to the CPU. An opening is located relative to the supports, it makes the heated working fluid after heat transfer upwardly transpire to the top cover, the heated working fluid within the groove of the top cover can be condensed to liquid, and be absorbed and transmitted to the bottom cover by the wick structure of supports bonded with the grooves to continue the operation of heat transfer.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The above objects and advantages of the present invention will be become more apparent by describing in detail exemplary embodiments thereof with reference to the attached drawings in which.

DETAILED DESCRIPTION OF THE INVENTION

Figure 1:
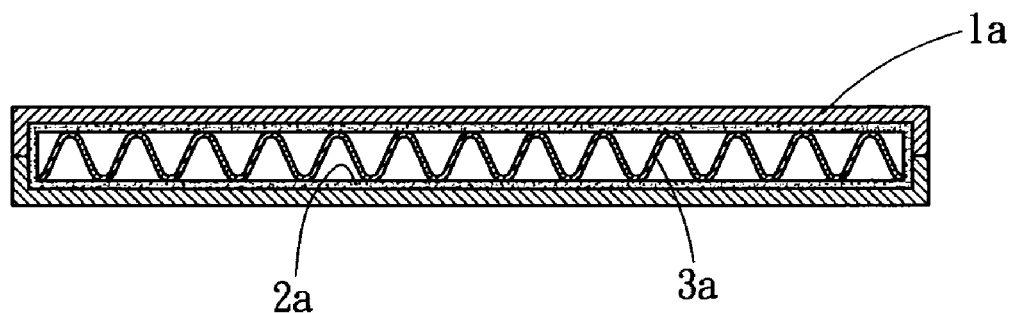
FIG. 1 shows a cross sectional view of a conventional heat conductive plate.

Reference will now be made in detail to the preferred embodiments of the present invention, examples of which are illustrated in the accompanying drawings. Wherever possible, the same reference numbers are used in the drawings and the description to refer to the same or like parts.

Figure 2:
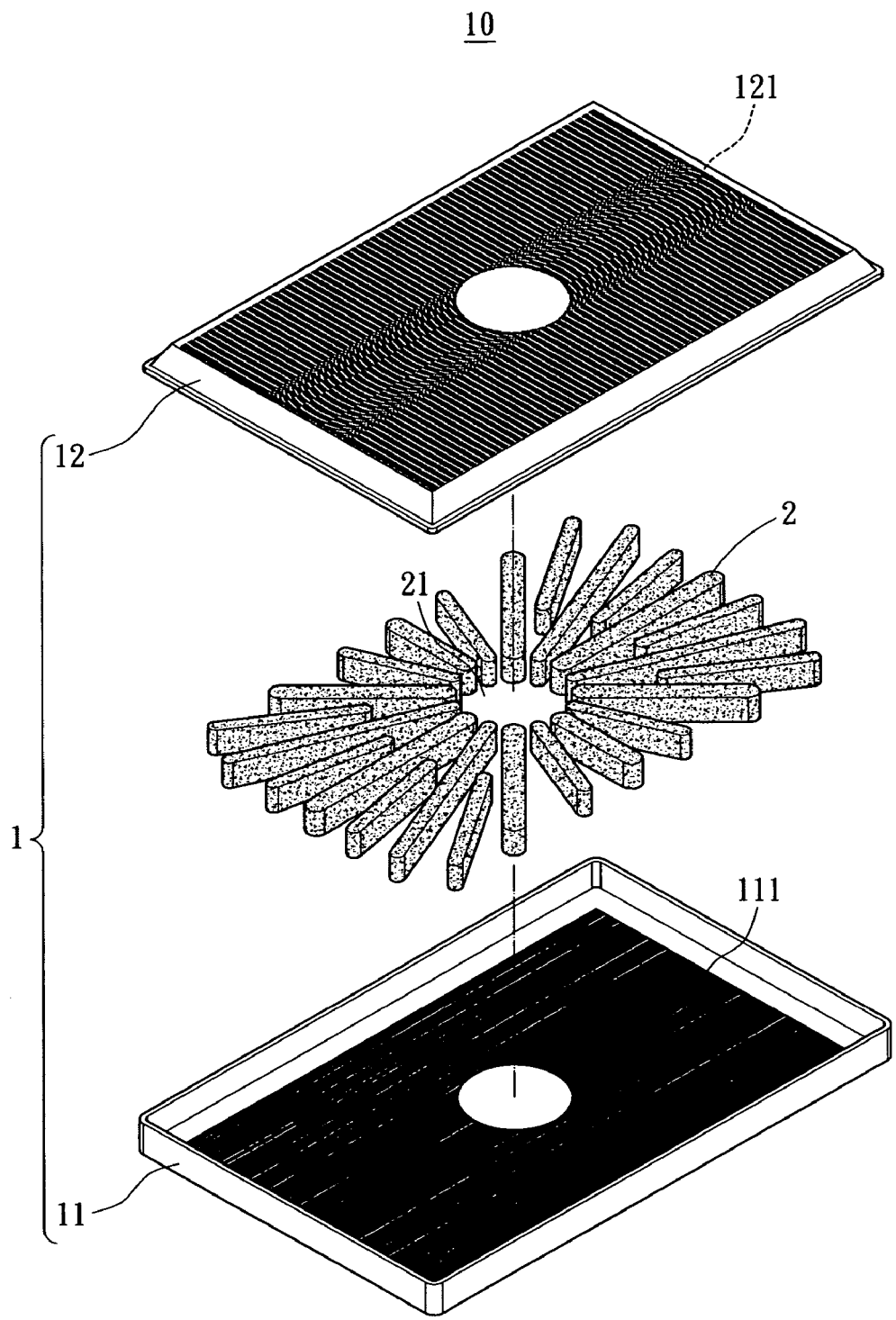
FIG. 2 shows an exploded view of a heat conductive plate according to the present invention.
Figure 3:
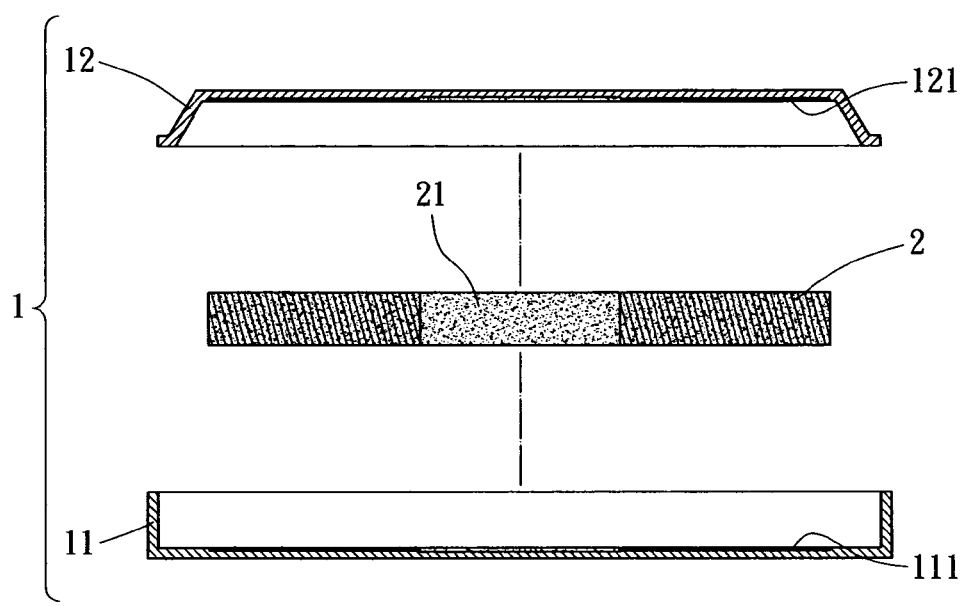
FIG. 3 shows a cross sectional view of an explosive heat conductive plate according to the present invention.
Figure 7:
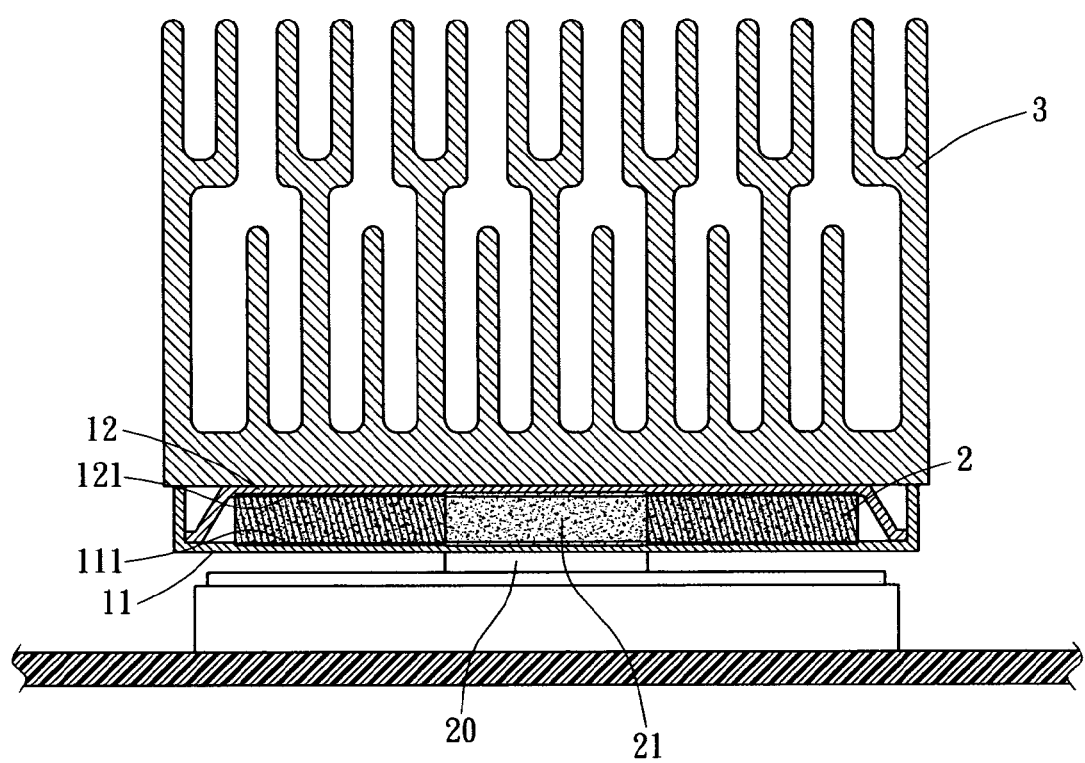
FIG. 7 shows an application of a heat conductive plate assembly of present invention.

Referring to FIGS. 2 and 3, a heat conductive plate 10 utilized for a CPU 20 (as shown in FIG. 7) to proceed the operation of the heat transfer includes a hollow case 1 having a bottom cover 11 and a top cover 12. A plurality of lateral grooves 111 and 121 are respectively formed on an inner surface of the bottom and top covers 11 and 12. Location relative to the CPU 20 should have a small mount of metal sinters formed on the bottom and top covers 11 and 12.

A plurality of supports 2 is located inside the heat plate 10, and each support 2 is coordinated to the size of the case 1 and uniformly distributed. In the embodiments of the present invention, the supports 2 are radially arranged, and each support 2 is formed within the case 1 by powder sintering. A porous wick structure is formed around the surface of each support 2. An opening 21 is further formed in the location relative to the CPU 20 so that the heated working fluid within the case 1 can be upwardly transported through the opening 21 to the top cover 12.

Figure 4:
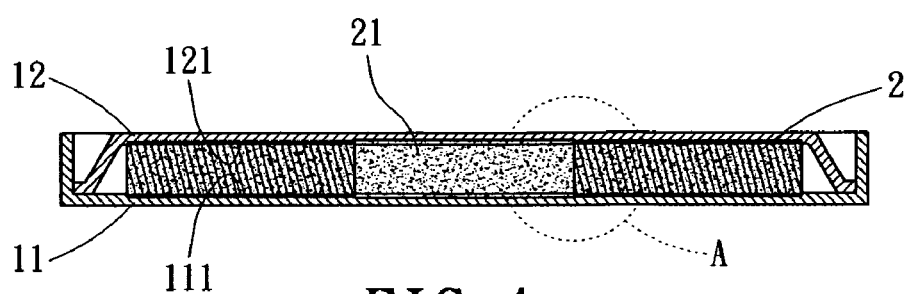
FIG. 4 shows a cross sectional view of a heat conductive plate assembly according to the present invention.
Figure 5:
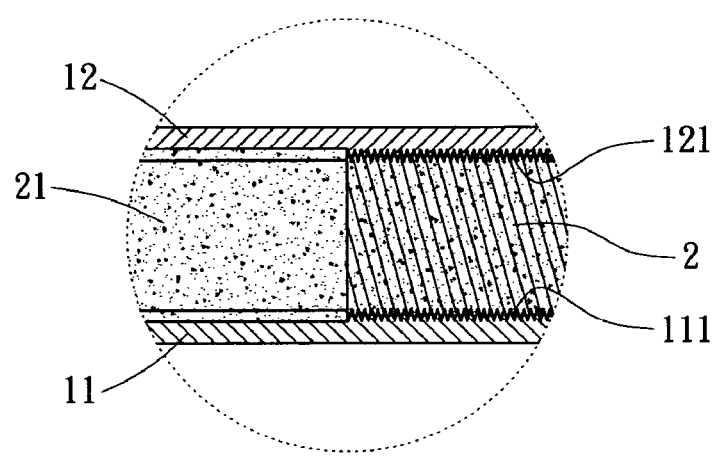
FIG. 5 shows an enlarged view taken from portion A of the FIG. 4 of the heat conductive plate according to the present invention.
Figure 6:
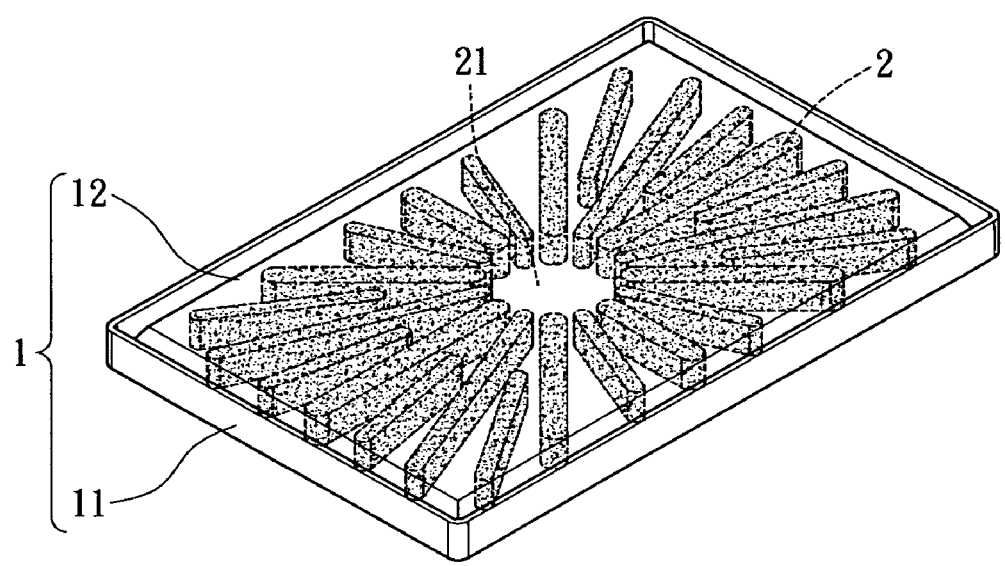
FIG. 6 shows a perspective view of a heat conductive plate assembly according to the present invention.

As shown in the FIGS. 4, 5, and 6, each support 2 is formed in the case 1 by powder sintering, then the grooves 111 and 121 respectively positioned in the inner wall of the bottom cover 11 and top cover 12 of the case 1. When the powder sintered supports 2 are fabricated within the case 1, each support 2 is firmly bonded to the bottom cover 11 ant top cover 12 via the grooves 111 and 121, and thereafter the working fluid is contained within the case 1 to finish the fabrication of the heat conductive plate 10.

Referring to FIG. 7, when the heat conductive plate 10 is utilized, the heat plate 10 is placed on the top surface of the CPU 20, and the opening 21 is located with respect to the CPU 20. A heat sink 3 or an aluminum extruded cooling fan is mounted on the top of the heat conductive plate 10.

In the cooling procedure, the heat produced from the CPU 20 can be transferred by the working fluid within the heat conductive plate. The heated working fluid will upwardly transport through the opening 21 to the top cover 12. Since the top of the heat conductive plate 10 is farther from the CPU 20 and has a heat sink 3 mounted above, the temperature is lower. Therefore, the heated working fluid accumulated in the grooves 121 of the top cover 12 will be condensed to liquid. The condensed liquid working fluid will be absorbed along the grooves 121 of the top cover 12 by the wick structure formed on the supports 2, then transmitted to the bottom cover 11 of the case 1.

According to the foregoing description, the present invention has following advantages:

(a) the wick structure in the heat conductive plate 10 is combined with the supports 2, which is firmly bonded to the inner walls of the heat conductive plate 10 to promote the efficiency.

(b) the grooves 111 and 121 are formed on the inner walls of the heat plate 10, which can increase the cooling area and make the heated working fluid rapidly condensed to liquid.

(c) the liquid working fluid can be quickly transmitted to the bottom cover 11 of the case 1, thereby increase and expedite the variation of the vaporation of the working fluid.

While the present invention has been particularly shown and described with reference to preferred embodiments thereof, it will be understood by those of ordinary skill in the art the various changes in form and details may be made therein without departing from the spirit and scope of the present invention as defined by the appended claims.

What is claimed is:

1. A heat conductive plate, comprising:
    a hollow case having a top cover and a bottom cover;
    a plurality of lateral grooves respectively formed on the inner surface of the top and the bottom covers of the case except the inner surfaces direct above or beneath an open area, where a small amount metal sinters are formed there and the open area usually is placed direct above a heat generating source; and
    a plurality of powder sintered supports positioned except at the opening area within the case, respectively bonded to the grooves, and a porous wick structure formed on the surface thereof.

2. The heat conductive plate of claim 1, wherein the case includes a bottom cover and a top cover.

3. The heat conductive plate of claim 1, wherein the supports are radially arranged within the case.

* * * * *